Figure 1:
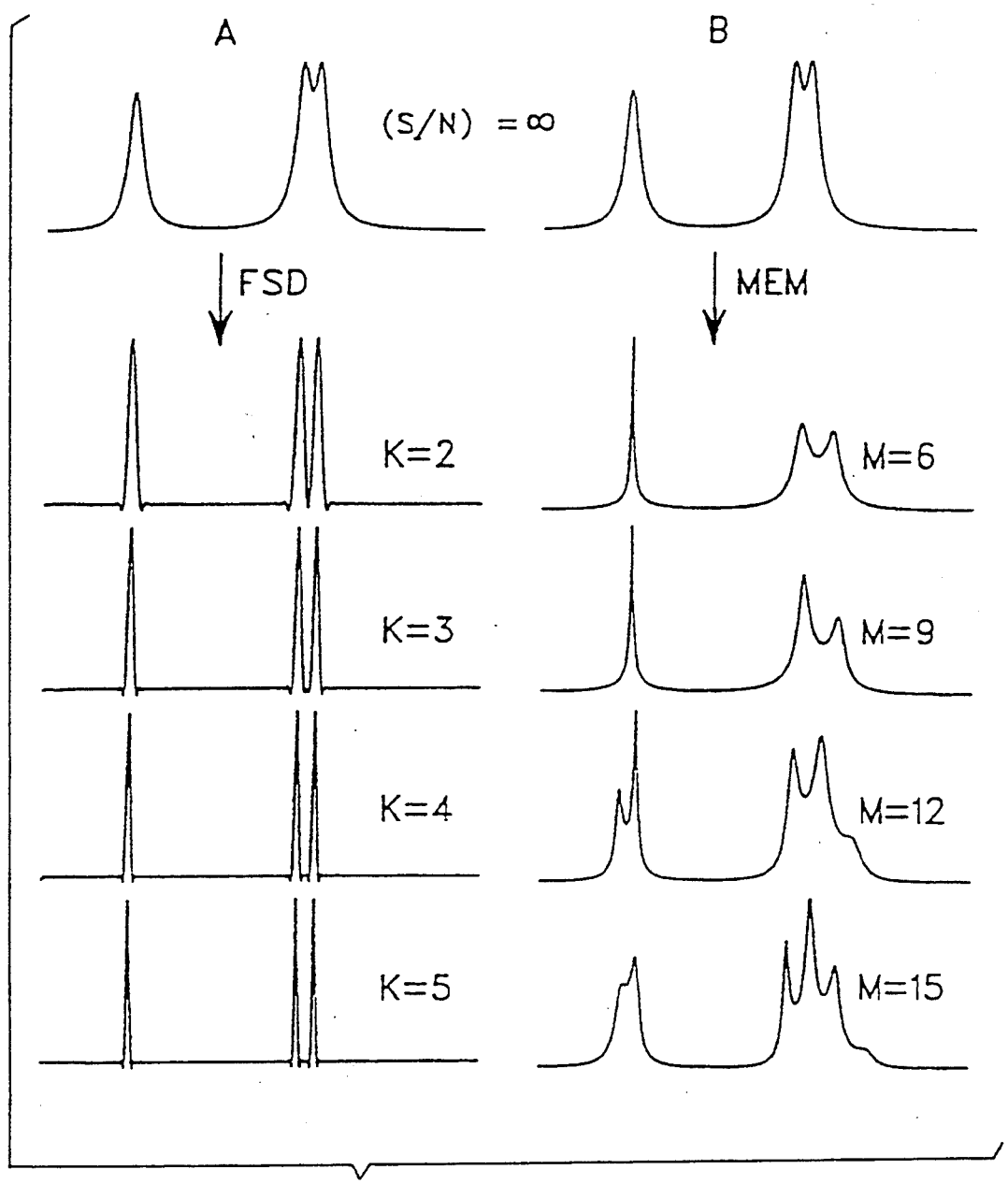

United States Patent [19]

Kauppinen

[11] Patent Number: 5,400,265
[45] Date of Patent: Mar. 21, 1995

[54] PROCEDURE FOR ENHANCING RESOLUTION OF SPECTRAL INFORMATION

[75] Inventor: Jyrki Kauppinen, Helsinki, Finland

[73] Assignee: Temet Instruments Oy, Helsinki, Finland

[21] Appl. No.: 81,365

[22] PCT Filed: Feb. 17, 1992

[86] PCT No.: PCT/FI92/00044
§ 371 Date: Jun. 30, 1993
§ 102(e) Date: Jun. 30, 1993

[87] PCT Pub. No.: WO92/14997
PCT Pub. Date: Sep. 3, 1992

[30] Foreign Application Priority Data

Feb. 18, 1991 [FI] Finland .................................. 910782

[51] Int. Cl.[6] .......................... G06J 3/45; G01R 23/16
[52] U.S. Cl. ..................... 364/576; 356/346; 364/498; 364/574
[58] Field of Search ............... 364/574, 498, 576, 525; 356/345, 346

[56] References Cited

U.S. PATENT DOCUMENTS 5,039,222 8/1991 Izumi .................... 356/346

OTHER PUBLICATIONS

Fourier & Computerized Infrared Spectroscopy, vol. 553, 1985 (Canada) K. H. Michaelian et al: "Resolution Enhancement of Photoacoustic FTIR Spectra", See pp. 260–261.

Electronics & Communications in Japan, vol. 72, No. 9, 1989 Kiyoshi Nishiyama et al: "Super-Resolution NMR Spectrum Estimation Method", see pp. 25–33.

Journal of Magnetic Resonance, vol. 43, 1981 R. G. Brereton et al: "The Application of Adjustable-Parameter Sine Bell Apodizationto Carbon 13 NMR Spectra", see pp. 224–233.

Journal of Magnetic Resonance, vol. 24, 1976 Antonio De Marco et al: "Digital Filtering with a Sinusoidal Window Function: An Alternative Technique for Resolution Enhancement in FT NMR", see pp. 201–204.

Primary Examiner—Emanuel T. Voeltz
Assistant Examiner—Edward Pipala
Attorney, Agent, or Firm—Ladas & Parry

[57] ABSTRACT

A procedure for enhancing the resolution of spectral data, in which the Fourier self-deconvolution method FSD is used to produce from the input spectrum a data set in an interval $0-L_t$, the maximum entropy method MEM is used to compute prediction error filter coefficients $\{a_k\}$ from this data, and by the linear prediction method LP, using coefficients $\{a_k\}$ and data points 0 to M. Data are predicted in the interferogram $I(x)$ beyond $L_t$, whereby output spectrum maximum line narrowing with minimum distortion is achieved.

8 Claims, 7 Drawing Sheets

PROCEDURE FOR ENHANCING RESOLUTION OF SPECTRAL INFORMATION

The present invention concerns a procedure performed entirely in the time domain, for increasing the resolution of spectral information, or for reducing the width of spectral lines, in FTIR, IR, NMR or other spectroscopy.

For instance when the quantities of gaseous impurities are monitored in industrial areas, factory halls, switching yards or other critical locations, or when air quality in general is studied, one has to be able to observe concentrations on the order of a few ppb. It is typical, in apparatus constructed for this purpose, to use chemical or semiconductor detectors which are sensitive to a single gas or a few gases only. Since infrared spectroscopy, at its best, enables the same sensitivity to be reached, it becomes possible to monitor simultaneously almost all measurable gases, and this being furthermore a comparatively rapid method of analysis, it is a noteworthy alternative in applications of this type.

However, the spectra obtained as results of measurement may be difficult of their interpretation. The gas which is being measured may contain many different constituents and various interference factors which impede the interpretation of the spectrum. The object of the present invention is to disclose a design which enables more accurate and more detailed interpretation of measured spectral information than before, and elimination of disturbances of the measurement.

Fourier Self-Deconvolution (FSD) and the Maximum Entropy Method (MEM) are both well-established procedures serving spectral line stabilizing (spectral information resolution enhancing). FSD is at present mainly employed in infrared spectroscopy of solid or liquid state, while MEM has been applied in numerous other branches of science as well.

FSD constitutes a linear method of deconvolution which is exclusively based on multiplication of the measured information in the time domain. In the present application text the FT-IR convention is followed, referring to the interferogram domain as the time domain and the spectral domain, as the frequency domain. MEM, on the other hand, represents a non-linear fitting method maximizing the information entropy of the output data. It is typical of this method that minor changes at the input cause powerful distortions in the output, and the results may even depend on the algorithm used. Furthermore, MEM gives only one of a plurality of possible solutions, whereas FSD yields an exact solution containing noise. While MEM is a well-approved procedure today, many practitioners of this method add a warning that it generates ghost lines or fails to find real, small lines.

In the following we shall first compare the FSD and MEM procedures as regards their efficiency to narrow spectral lines.

We shall use the following pair of Fourier transformations in this text:

$$E(v) \int_{-\infty}^{\infty} I(x) \exp(i2\pi vx)dx = \{I(x)\} \quad (1)$$

$$I(x) = \int_{-\infty}^{\infty} E(v) \exp(-i2\pi vx)dv = {}^{-1}\{E(v)\}$$

where $E(v)$ is the spectrum (i.e., intensity as a function of wave number), $I(x)$ is the interferogram (i.e., intensity as a function of optical path difference), and $\{\ \}$ and ${}^{-1}\{\ \}$ are the Fourier transform and the inverse Fourier transform, respectively.

Fourier self-deconvolution (FSD) takes as input a spectrum $E(v)$, consisting of lines with assumed line shapes $W(v)$. These input line shapes are converted to a desired output line shape $W_o(v)$ by the time domain operation specified in Formula 2:

$$E'(v) = \left\{ \frac{{}^{-1}\{W_o(v)\}}{{}^{-1}\{W(v)\}} \cdot {}^{-1}\{E(v)\} \right\} \quad (2)$$

where $W'(v)$ is the deconvolved spectrum having the output line shape $W_o(v)$. If the desired line shape is narrower than the initial line shape, line narrowing has been achieved. The line shape, line narrowing has been achieved. The line narrowing factor K, loosely referred to as "resolution enhancement factor", is given by the formula:

$$K = \frac{FWHH(W)}{FWHH(W_o)} \quad (3)$$

where $FWHH(W)$ and $FWHH(W_o)$ are the full width at half height of $W(v)$ and $W_o(v)$, respectively.

The main advantage of FSD is that it is a linear procedure, that is, the Fourier self-deconvolutions of $E_1(v)$ and $E_2(v)$:

$$E_1(v) + E_2(v) = E_1(v) + E_2(v) \quad (4)$$

It is well-known (notably in electronics) that an output signal $S'(t)$ can be defined as the convolution of the input signal $S(t)$ and the impulse response $h(t)$ (of a circuit). Therefore, in the time domain, $$S'(t) = h(t) * S(t) = \int_{-\infty}^{\infty} h(t') S(t - t')dt' \quad (5)$$

Using the interferometric nomenclature, let us postulate that the input signal $I(x) = {}^{-1}\{E(v)\}$ in the time domain has passed through the filter defined by the impulse response $h(t)$. Then, the output signal will be:

$$I'(x) = h(x) * I(x) \quad (6)$$

This can be expressed in discrete form as $$I'_j = \sum_{k=1}^{M} h_k I_{j-k} \quad (7)$$

where M specifies the length of the impulse response function and $h_k$ in the convolution sum contains the sampling interval x. The error $\{e_j\}$ between the input data $\{I_j\}$ and output data $\{I'_j\}$ is given by $$e_j = I_j - I'_j = I_j - \sum_{k=1}^{M} h_k I_{j-k} = \sum_{k=0}^{M} a_k I_{j-k} \quad (8)$$

where $$a_k = \begin{Bmatrix} 1 & k = 0 \\ -h_k & k = 1,2,3,\ldots,M \end{Bmatrix} \quad (9)$$

The digital filter defined by the impulse response $\{a_k\}$ k=8,1,2,...M is called the prediction-error filter because the output of this filter is the error vector $\{e_j\}$. Notice that the filter defined by $\{h_k\}$ is different from $\{a_k\}$. Using Equations 6 and 7, the input spectrum will be given by $$E(\nu) = \{I(x)\} = \{\Gamma(x) + e(x)\} = \{h(x)*I(x-)\} + e(x)\} = \{h(x)\} \cdot E(\nu) + (\nu) \quad (10)$$

where ($\nu$) is now the error spectrum. From Eq. 10 the input spectrum $E(\nu)$ can then be derived as $$E(\nu) = \frac{(\nu)}{1 - \{h(x)\}} = \frac{(\nu)}{\{a(x)\}} \quad (11)$$

In this formula, h(x) or a(x) can be computed (see above), but ($\nu$) must be approximated in some way. From Eq. 11, with the denominator implicitly expressed by the use of Eq. 9, the power spectrum of $E(\nu)$ can be estimated as $$|E(\nu)|^2 = \frac{|(\nu)|^2}{\left|\sum_{k=0}^{M} a_k \exp(i2\pi\nu k\Delta x)\right|^2} \approx \frac{\sigma_M^2}{\left|\sum_{k=0}^{M} a_k \exp(i2\pi\nu k\Delta x)\right|^2} \quad (12)$$

where $x = \frac{1}{2}\nu_{max}$ is the sampling interval and $$\sigma_M^2 = \frac{1}{2\nu_{max}} \int_{-\nu_{max}}^{\nu_{max}} |(\nu)|^2 d\nu = \frac{1}{2L} \int_{-L}^{L} |e(x)|^2 dx \approx \frac{1}{M+1} \sum_{k=0}^{M} |e_k|^2 \quad (13)$$

In other words, $\sigma_M^2$ is simply the expectation value of the error power, or $\sigma_M$ is the standard deviation of the error vector $\{e_k\}$. According to Equations 8 and 9, the input data $\{I_j\}$ obey the following equation:

$$I_j = -\sum_{k=1}^{M} a_k I_{j-k} + e_j \quad j = M, M+1, M+2, \ldots, N \quad (14)$$

where N is the number of sampling points. Upon multiplying the formula 14 $I^*_{j-n}$ (complex conjugate of $I_{jn}$), and taking the expectation value (i.e., the average) for both sides of this equation, one obtains for $0 \leq j-n \leq N$ and $0 \leq j-k \leq N$:

$$\frac{1}{N+1} \sum_{j=0}^{N} I_j I^*_{j-n} = \frac{-1}{N+1} \sum_{k=1}^{M} \sum_{j=0}^{N} a_k I_{j-k} I^*_{j-n} + \frac{1}{N+1} \sum_{j=0}^{N} e_j I^*_{j-n} \quad (15)$$

Since $e_j$ and $I^*_{j-n}$ do not correlate if n=/0, we have $$\frac{1}{(N+1)} \sum_{j=0}^{N} e_j I^*_{j-n} = \frac{1}{(N+1)} \sum_{j=0}^{N} |e_j|^2 \approx \sigma_M^2 \quad (16)$$

If the autocorrelation coefficient $R_n$ is $$R_n = R^*_{-n} = \frac{1}{N+1} \sum_{j=0}^{N} I_j I^*_{j-n} \quad (17)$$

Eq. 15 can be expressed in the following form:

$$\begin{Bmatrix} R_n = -\sum_{k=1}^{M} a_k R_{n-k} & n > 0 \\ R_o = -\sum_{k=1}^{M} a_k R_{-k} + \sigma_M^2 & n = 0 \end{Bmatrix} \quad (18)$$

Since $a_o = 1$, Eq. 18 becomes $$\sum_{k=0}^{M} a_k R_{n-k} = \begin{Bmatrix} \sigma_M^2 & n = 0 \\ 0 & n > 0 \end{Bmatrix} \quad (19)$$

which is known as the Yule-Walker equation and can be expressed in matrix form as $$\begin{bmatrix} R_o & R_{-1} & \cdots & R_{-M} \\ R_1 & R_o & \cdots & R_{1-M} \\ \cdot & \cdot & & \cdot \\ \cdot & \cdot & & \cdot \\ \cdot & \cdot & & \cdot \\ R_M & R_{M-1} & \cdots & R_o \end{bmatrix} \begin{bmatrix} 1 \\ a_1 \\ \cdot \\ \cdot \\ \cdot \\ a_M \end{bmatrix} = \begin{bmatrix} \sigma_M^2 \\ 0 \\ \cdot \\ \cdot \\ \cdot \\ 0 \end{bmatrix} \quad (20)$$

The maximum entropy spectral estimation in its basic form is accomplished as follows. First, the $\{a_k\}$ coefficients are derived by use of Eq. 19 or 20 so as to minimize $\sigma_M^2$. Then, when the power spectrum of E( ) is computed from Eq. 12, the information entropy S=−Constant, $*\Sigma|E_j|\ln|E_j|$ is maximized. Thus, minimizing $\sigma_M^2$ in Eq. 20, will maximize the entropy S, provided the approximation in Eq. 12 is valid.

However, the solution to Eq. 20 poses some problems. A major difficulty is that the autocorrelation coefficients $R_k$ are not well defined with the aid of Eq. 17, owing to the finite length of the data set. This problem has been eliminated by Burg's modification of MEM, in which the coefficients $\{a_k\}$ k=1,2,...,M, as well as $\sigma_M^{-1\,2}$ and $R_k$, are recursively computed from the previous values $\{a_k\}$ k=1,2,...,M−1, $\sigma_{M-1}^2$ and $R_k$, so that the error power, representing the average of the forward and backward predictions, is minimized.

The linear prediction (LP) method is based on Eq. 14. Since the computed coefficients $\{a_k\}$ minimize $\sigma_M$ and the error vector $\{e_j\}$, we can approximate $e_{j=Ij} - I'_j = 0$ or $I_{j=I'j}$. Now Eq. 14 can be rewritten as $$I_j \approx -\sum_{k=1}^{M} a_k I_{j-k} \quad (21)$$

or $$I'_j \approx -\sum_{k=1}^{M} a_k I'_{j-k}$$

If $\{I_j\}$ $j=0,1,2,\ldots,M$ and the coefficients $\{a_k\}$ $j=1,2,3,\ldots,M$ are known, the data set may be extended beyond $I_M$ by recursively computing new data $I_{M+1}$ as follows:

$$I_{M+i} = - \sum_{k=1}^{M} a_k I_{M+i-k} \quad i = 0,1,2,\ldots \quad (22)$$

Since $I_j = I'_j$, we later use a denotation where the original data set is the input signal, and the calculated data set is the output signal. Thus, in Linear Prediction, we assume that the first $M+1$ output data points are equal to the $M+1$ input data points. Beyond the $M^{th}$ data point there exist only the (predicted) output data points.

Figure 2:
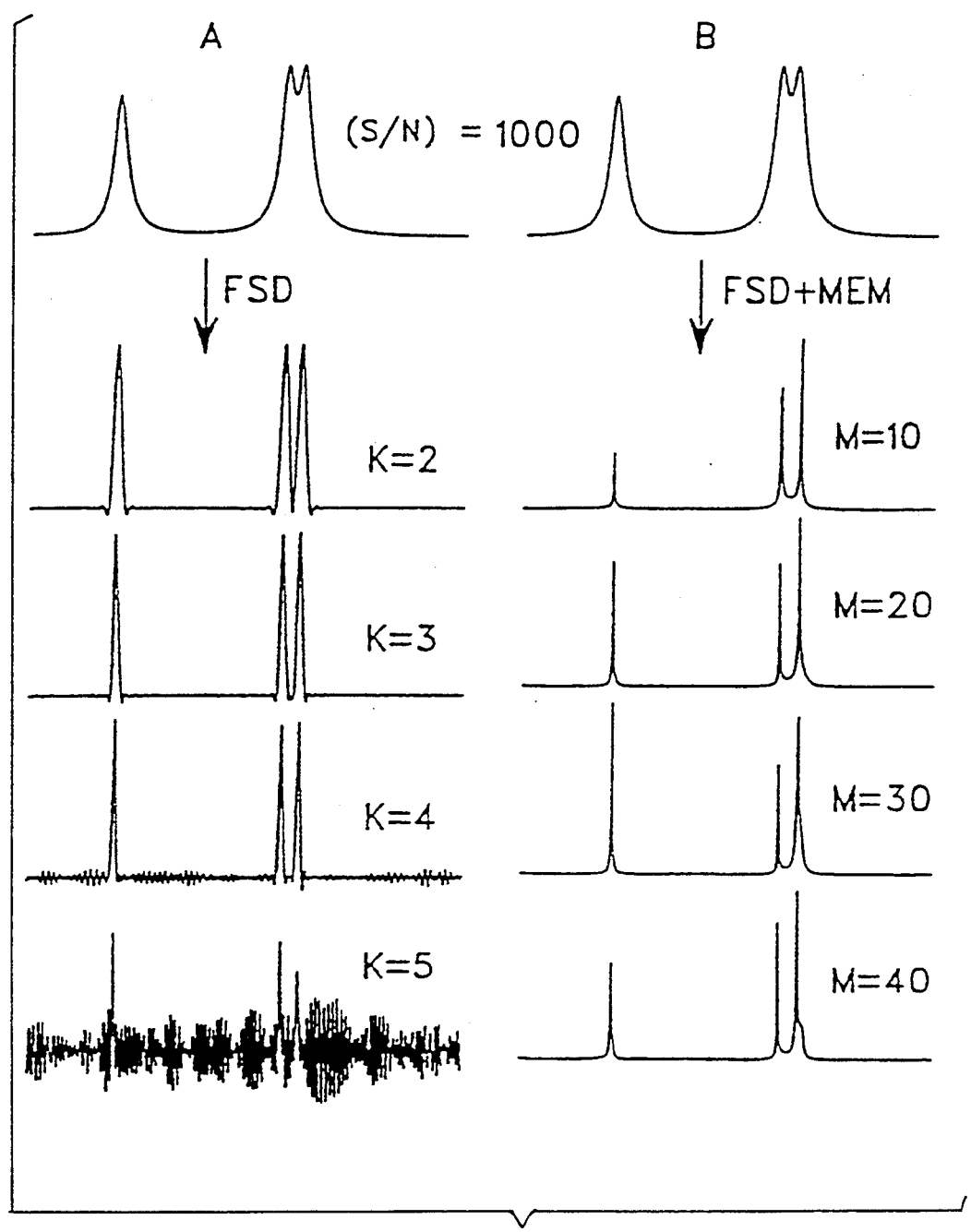
Figure 3:
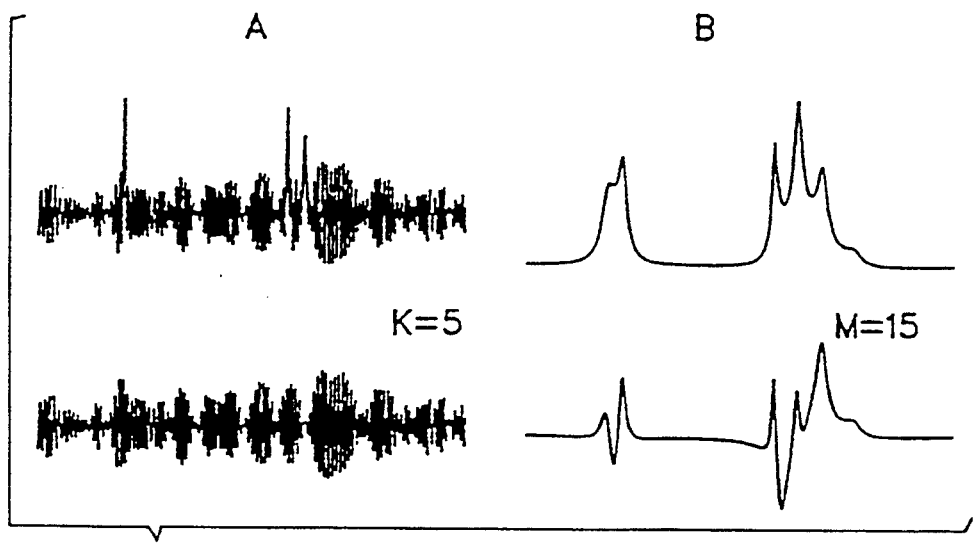
Figure 4:
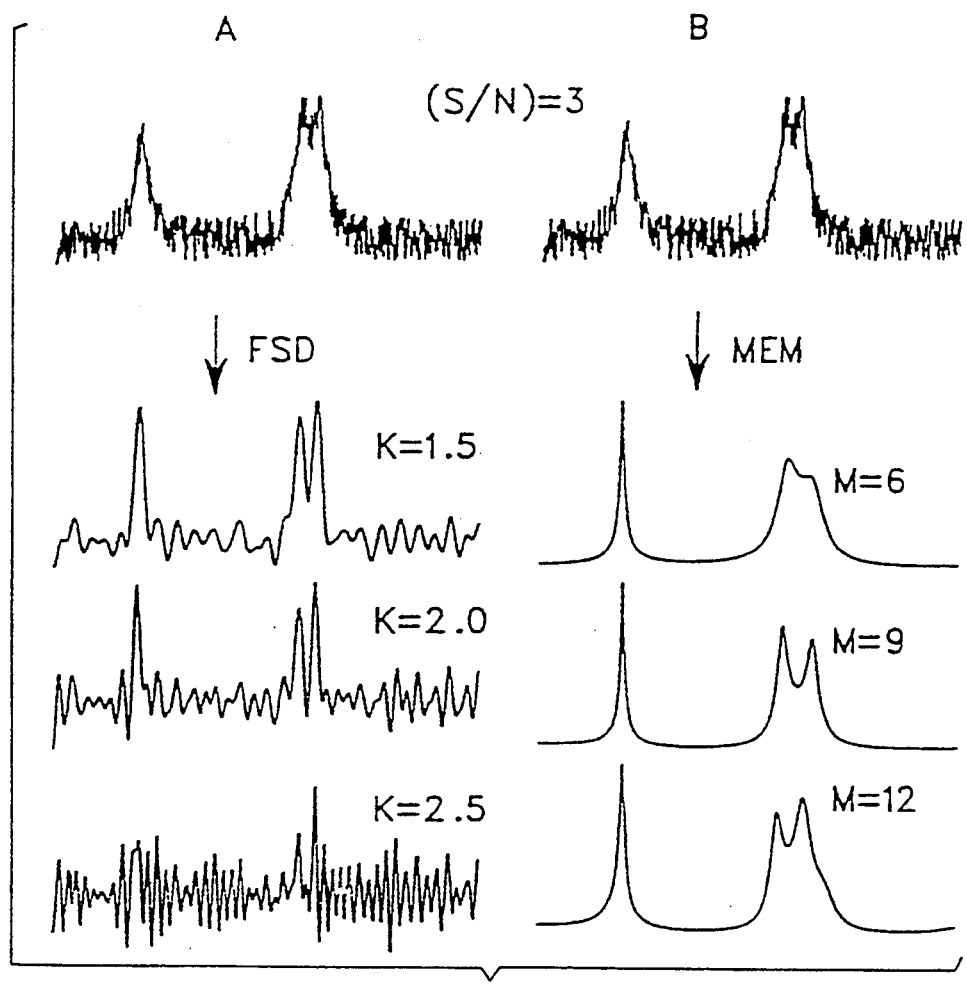
Figure 5:
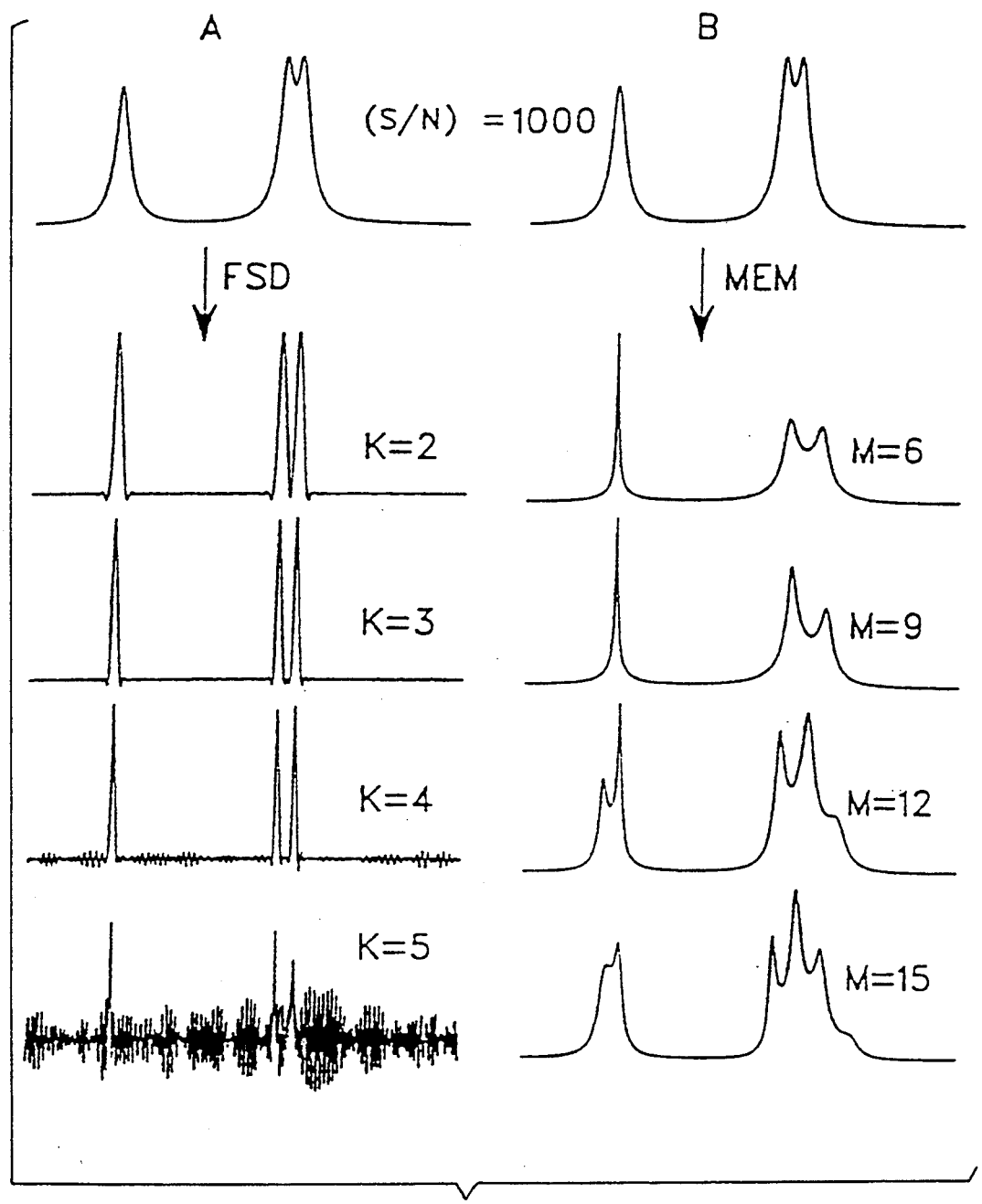
Figure 6:
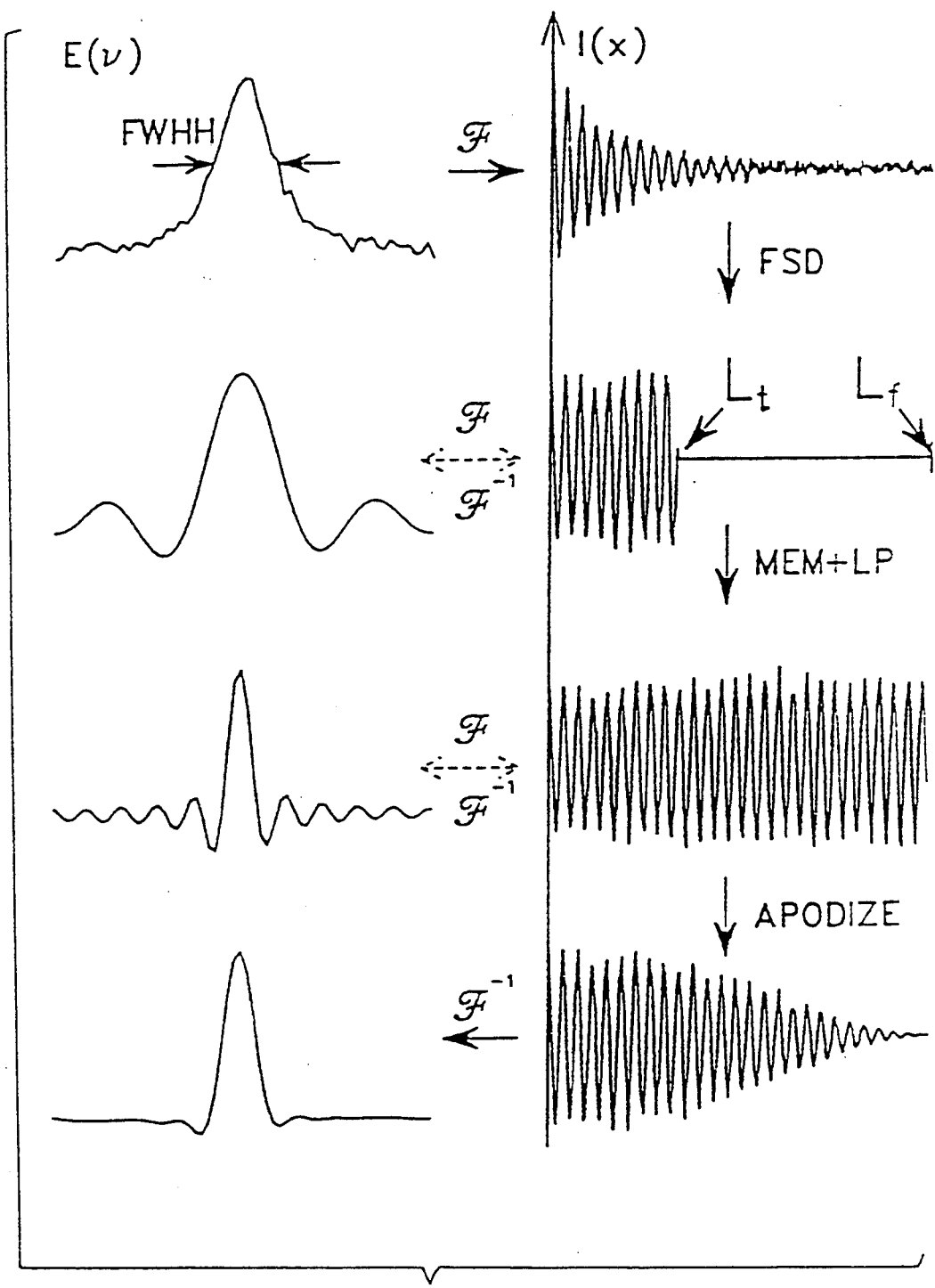
Figure 7:
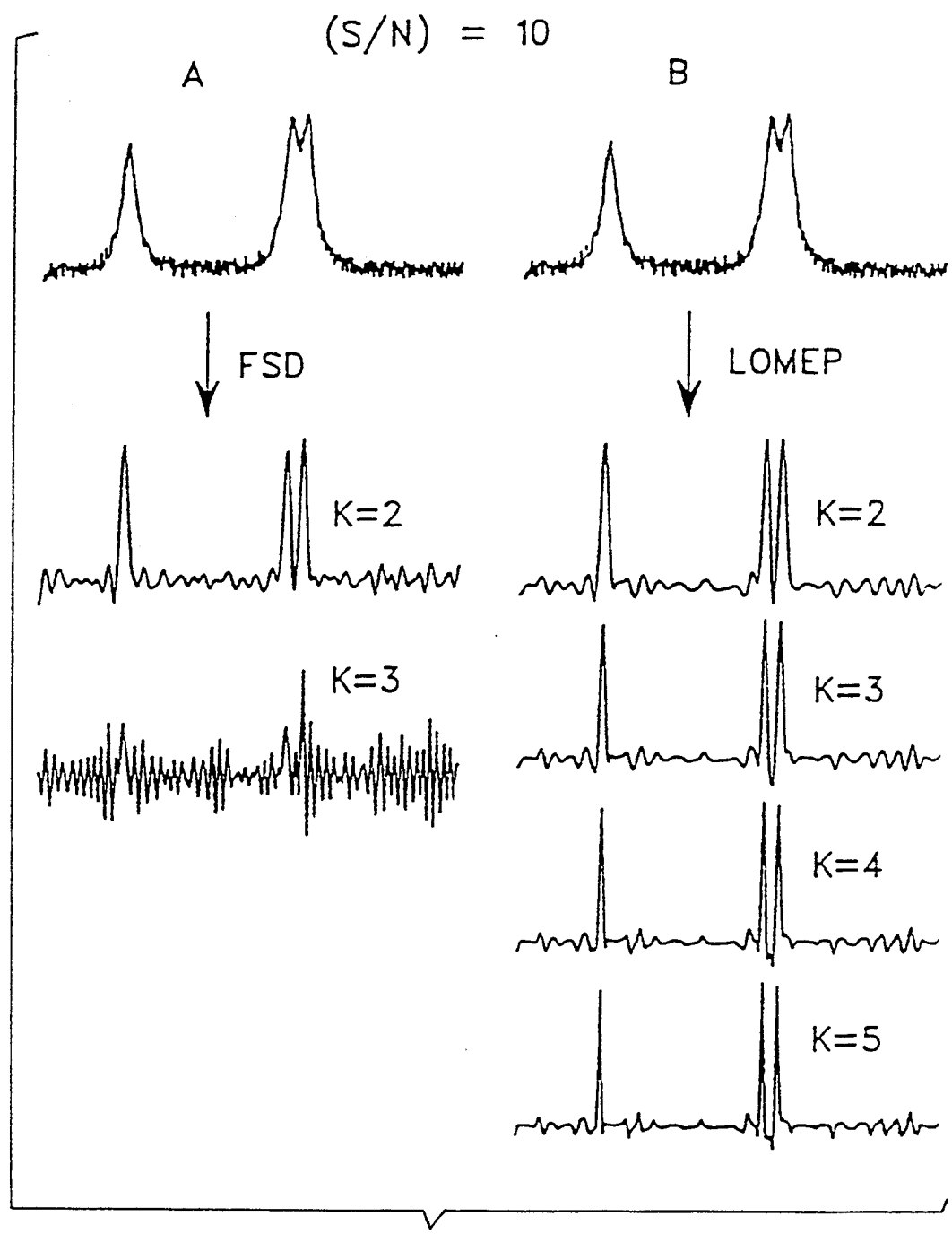

In the following, the technique of prior art and the procedure of the invention shall be described in detail, referring to the attached drawings, wherein FIG. 1, top row, shows a test spectrum of three Lorentzian lines without noise, Column A is the FSD spectrum with a Bessel output line shape when $K=2$, 3, 4 and 5, and Column B is the spectrum computed by Burg's MEM method with prediction error filters $M=6$, 8, 12 and 15 and the data points numbering 50, FIG. 2 is the same presentation as in FIG. 1, but with a test spectrum having signal/noise ratio 1000, FIG. 3 illustrates the noise in FSD when $K=5$, and the distortion in MEM when $M=15$, the top row being the bottom row of FIG. 2, FIG. 4 presents a comparison of the FSD and MEM procedures in a case of extremely noisy spectra (S/N=3), FIG. 5 is a comparison of FSD and FSD+MEM in a case with favourable signal/noise ratio (S/N=1000): Column A is the same as in FIG. 2, while Column B is the spectrum obtained by MEM from the FSD spectrum, with sinc line shape, FIG. 6 a diagrammatic presentation of the LOMEP method along the route indicated by solid arrows, the dotted line arrows correlating the data in the time domain with the corresponding frequency domain presentation, FIG. 7 is a comparison of the FSD and LOMEP spectra in the case of poor signal/noise ratio (S/N=10), and FIG. 8 displays the advantages of the trifunction method LOMEP over FSD, compared in the case of a spectrum with poor S/N ratio, the top spectrum being composed of Lorentzian lines at 200, 600 and 610 cm$^{-1}$ of equal intensities and widths.

In the following, the Fourier self-deconvolution method shall be compared with the maximum entropy method, and for test spectrum three Lorentzian lines are used which have equal widths and intensities and where one line is isolated and the other two are overlapping.

In FIG. 1 is presented the comparison of the FSD and MEM methods in a case in which there is no noise in the test spectrum. Column A in FIG. 1 depicts the FSD spectrum, which has Bessel output line shape, $W_o(\nu)$ in FIG. 2, and where the line narrowing coefficient $K=2$, 3, 4 and 5. Column B depicts the amplitude spectrum computed by Burg's MEM method with prediction error filters $M=6$, 8, 12 and 15. The amplitude spectrum was derived from formula 12 and taken as the square root of the power spectrum. For a given number of input data points the number M is the sole adjustable parameter in MEM. The top row of each column in FIG. 1 shows the input spectrum. Column A illustrates the FSD method of line narrowing, which is applied to the test data. The line shapes of the deconvoluted spectrum are precisely Bessel. On the other hand, the MEM method, illustrated in Column B, yields an output spectrum with various distortions depending on the number M of the prediction error filter. It is fair, in this case, to point out that the FSD method uses the information of the line shape, whereas MEM does not.

In FIG. 2 the above comparison of FSD and MEM is carried on to a case in which random noise has been added to the input spectrum so that the signal/noise ratio is 1000. Once again, the FSD method results in a spectrum having the same degree of line narrowing as in FIG. 1A, but with increased noise. It is important to note that the noise level (r ms) is constant over the spectrum and that there is no correlation between lines and noise, i.e., the noise on a line is the same as the noise elsewhere. This means that the peak heights never deviate from their theoretical values by more than the noise amplitude. The situation is different in the spectrum of Column B in FIG. 2. The output spectrum obtained by MEM has no noise, only distortion of the lines. In other words, in the regions without lines the MEM spectrum is noise-free, yet strong distortions are present close to the true lines, which are impossible to estimate. Also, the degree of line narrowing is not readily adjustable in MEM by changing M.

FIG. 3 illustrates the noise/distortion in FSD and in MEM. The lower row in this figure displays in FSD, when $K=5$, the accrued noise and in MEM, when $M=15$, the incurred total distortion. The upper row is the bottom row of FIG. 2.

A comparison of the FSD and MEM methods in the case of an extremely noisy spectrum (S/N not more than 3) is shown in FIG. 4. When FIG. 3B is compared with FIG. 2B, it is obviously evident that the nature of the MEM spectrum's distortion has changed, but there is not yet any evidence of white noise. On the other hand, the spectrum obtained by the FSD method (FIG. 4A) reveals a considerable deterioration in the signal-to-noise ratio.

The question arises as to why MEM does not yield better results than what is shown in FIG. 1B. The reason is that the original MEM method of Burg rests on the basic assumption that the time series must be stationary, i.e., not decaying. In other words, the MEM approach postulates that the signal S(t) consists of a sum (see the formula) in which the prediction error filter acts like an electronic filter. This, however, is not the case in solid or liquid state IR or NMR spectra. The time domain signals have a roughly exponential decay, owing to their Lorentzian line shape. In addition, Eq. 12 contains an approximation, namely $|E(\nu)|^2 = \sigma_M^2$, which implies that even when the $\{a_k\}$ coefficients are correct, $|E(\nu)|^2$ can still be distorted.

The maximum entropy method is best applied to spectra consisting only of sinusoidal signals with constant amplitudes in the time domain. Accordingly, the best line shape for MEM would be a sine function (i.e., the Fourier transform of a boxcar function). This fact inspired the Applicant to use FSD to change the actual line shape to a sinc function, i.e., $W_o(\nu)$ now becomes a sinc function in Eq. 2.

We shall start with a combination of FSD and MEM. FIG. 5 shows spectra obtained with Burg's modified MEM, but derived from an FSD spectrum with sinc line shapes. In Column A in FIG. 5 are depicted the output spectra obtained by FSD (see FIG. 2A), in order to facilitate comparison. In the FSD+MEM method, the number M is the number of non-zero data in the corresponding interferogram. This obviously results in a greatly improved MEM output, which is not unexpected since by using FSD data for input to MEM the line shape information is now taken into account, which should improve the output data. However, there are still distortions to the intensity and shape of the lines, and the line narrowing process is not well controlled with MEM.

The object of the present invention is to eliminate the above-described drawbacks of methods of prior art. Regarding the features which are characteristic of the invention, reference is made to the claims section.

The invention discloses a novel procedure which combines FSD with some features of MEM and with the corollary thereof, linear prediction (LP). This combination of FSD, MEM and LP is called the LOMEP method (Line shape Optimized Maximum Entropy linear Prediction). The essence of the procedure of the invention is utilizing of the strong points of each of these methods in order to achieve maximum line narrowing with minimum distortion.

The distortions in the MEM spectrum are due to Eq. 12. Therefore, instead of using the formula 12, line narrowing is accomplished by applying linear prediction to extend the signal. In the time domain there exists a point $x=L_t$ (t=truncated) where the signal becomes roughly equal to the noise. We apply MEM to the "good" data between 0 and $L_t$ only to derive the correlation coefficients $\{a_k\}$ needed in linear prediction, formula 22.

Thus, in the trifunction method LOMEP the FSD function is first used to produce a set of data in the interval from 0 to $L_t$. The second function MEM is then used to generate the coefficients $\{a_k\}$ from these data. Finally, the third function LP uses the coefficients $\{a_k\}$ towards predicting the data in the interferogram beyond $L_t$. FIG. 6 schematically illustrates the basic concept of the LOMEP method. The first step uses FSD to generate an interferogram I(x), consistent with a sinc function as output line shape. This interferogram is then used as input to MEM, from which the prediction error filter coefficients $\{a_k\}$ are computed. In the present example the number M of the prediction error filter has been selected to equal the number of input data points, i e , $L_t=M$ x; because the signals are now cosine waves with constant amplitudes, there is a strong correlation between all data points.

The next step is prediction of the extra data points in the interferogram I(x) beyond the initial point $L_t$, by using the coefficients $\{a_k\}$ and the data points from 0 to M. This is accomplished by means of linear prediction, given in the formula 22. Theoretically, the Fourier transform of this expanded interferogram has sinc line shape. Therefore, prior to computing the final spectrum, the expanded interferogram should be apodized in order to give a more useful line shape in the final spectrum. The ultimate K factor obtained with LOMEP depends on $L_f=N_f$ x (where $N_f+1$ is now the total number of data points) and on the desired output line shape.

FIG. 7B illustrates the results that have been obtained with the LOMEP method, applied to a spectrum with S/N=10. As shown in Column A, the maximum line narrowing realistically achievable in this case with FSD is K=2. On the other hand it is possible with the trifunction method LOMEP to attain K values of 5 and higher.

Furthermore, the S/N ratio of the LOMEP output spectrum is not dependent on the K value: it depends only on $L_t$, which in its turn is a function of the initial S/N. The M value used in FIG. 7B was 60, and the S/N ratio is roughly the same for all K values, the reason being that the noise only comes from the data in the interval from 0 to $L_t$ in the interferogram. There is no noise in the predicted portion $x>L_t$. It should also be noted that the position, shape and intensity of the lines are only affected by the noise, as in the case of the FSD spectrum. Consequently, this method retains all the advantages of the linear methods. Again, since only the data between 0 and $L_t$ are used, LOMEP does not alter the intensity, nor the position, of the input lines. The data predicted beyond $L_t$, on the other hand, only changes (i.e., reduces) the line widths if the coefficients $\{a_k\}$ are correct. Compare for instance the spectrum of FIG. 7B with the spectrum presented in FIGS. 5A, 2B and 1B, all of which have different S/N ratios.

Figure 8:
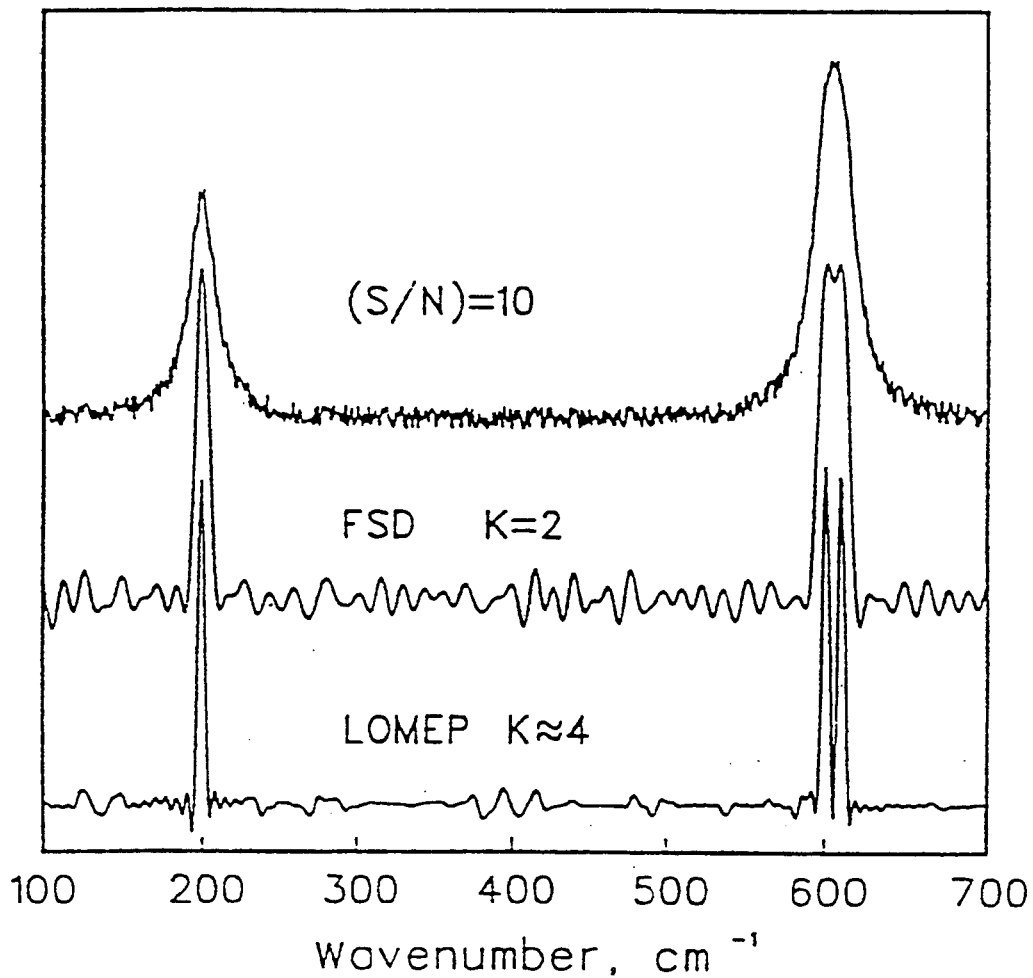

In the last example, FIG. 8 illustrates a case in which two lines in the neighbourhood of 600 cm$^{-1}$ lie so close to each other that FSD is not successful in their complete separation, whereas LOMEP leads to a well-resolved doublet with correct intensities (peak heights).

The critical factor in optimation of LOMEP is the value of $L_t$, which is a function of the S/N ratio in the original spectrum. A remaining question is, how many extra data points should be computed by formula 22. In theory this should not be a critical factor; in practice, however, noise and/or an erroneous FSD line shape will set a certain limit to this number.

I claim:

1. A method of examining a sample to determine the presence or absence of a component therein comprising:
   producing a spectral image of a sample in the form of spectral data,
   spectroscopically producing spectral data from a sample representing the composition of said sample,
   producing from said spectral data an interferogram of said sample between 0 and $L_f$,
   producing by the Fourier self-deconvolution method FSD a data set from the obtained interferogram in an interval from 0 to $L_t$ where $L_t<L_f$, said data set comprising data points O to M where M is the number of data points in said data set;
   computing from said data set by the maximum entropy method MEM prediction error filter coefficients $\{a_k\}$, where k=0,1,2,...M;
   predicting data beyond $L_t$ in the interferogram using said prediction error filter coefficients $\{a_k\}$, and the data points 0 to M in said data set to achieve maximum line narrowing with minimum distortion in the resulting spectrum, and
   examining lines in said spectrum to detect presence or absence of a component in the composition of said sample, whereby the narrowing of the lines and the minimization of distortion facilitates the examination and detection of said component.

2. A method according to claim 1, comprising applying said FSD to form said interferogram I(x) whose output line shape is consistent with a sinc function.

3. A method according to claim 1, comprising, prior to computing the final spectrum apodizing the expanded interferogram I(x) to alter the line shape in the final spectrum.

4. A method according to claim 1, comprising determining the extra data points in the linear prediction by the formula:

$$I_{M+i} = - \sum_{k=1}^{M} a_k I_{M+i-k} \quad i = 0,1,2,\ldots \quad (22)$$

5. A method according to claim 1, comprising establishing the point $x = L_t$ in the time domain to correspond to stays in the point where the signal is substantially equal to the noise.

6. A method according to claim 1, comprising rendering said interferogram substantially free of noise.

7. A method according to claim 1, comprising providing the spectral data with a signal/noise ratio of 1000, 100, 10 or about 3.

8. A method according to claim 1, wherein said sample is solid, liquid or gaseous.

* * * * *